(12) United States Patent
Ji et al.

(10) Patent No.: US 9,748,899 B2
(45) Date of Patent: Aug. 29, 2017

(54) MEMS AMPLITUDE MODULATOR AND MEMS MAGNETIC FIELD SENSOR INCLUDING SAME

(71) Applicant: LG INNOTEK CO., LTD., Seoul (KR)

(72) Inventors: Chil Young Ji, Seoul (KR); Yong Jun Ko, Seoul (KR); Seung Hwa Kwon, Seoul (KR); Sang Won Seo, Seoul (KR); Chul Kim, Seoul (KR); Jeong Gi Seo, Seoul (KR); Do Han Jun, Seoul (KR); Wan Seop Choi, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/913,537

(22) PCT Filed: Aug. 5, 2014

(86) PCT No.: PCT/KR2014/007246
§ 371 (c)(1),
(2) Date: Feb. 22, 2016

(87) PCT Pub. No.: WO2015/026079
PCT Pub. Date: Feb. 26, 2015

(65) Prior Publication Data
US 2016/0211803 A1    Jul. 21, 2016

(30) Foreign Application Priority Data
Aug. 21, 2013  (KR) .................... 10-2013-0099298

(51) Int. Cl.
*H03C 1/00*       (2006.01)
*H03C 1/46*       (2006.01)
(Continued)

(52) U.S. Cl.
CPC ........... *H03C 1/46* (2013.01); *G01R 33/0052* (2013.01); *G01R 33/02* (2013.01);
(Continued)

(58) Field of Classification Search
CPC .. H02J 7/025; H02J 50/12; H02J 17/00; H02J 5/005; H02J 2007/0096; H02J 50/10;
(Continued)

(56) References Cited

U.S. PATENT DOCUMENTS 5,812,065 A * 9/1998 Schrott ................ G01S 13/753
235/380
2015/0022939 A1  1/2015 Seo et al.

FOREIGN PATENT DOCUMENTS

JP         08334379 A     12/1996
KR    1020060094666 A      8/2006
(Continued)

OTHER PUBLICATIONS

International Search Report in International Application No. PCT/KR2014/007246, filed Aug. 5, 2014.

*Primary Examiner* — Arnold Kinkead
(74) *Attorney, Agent, or Firm* — Saliwanchik, Lloyd & Eisenschenk

(57) ABSTRACT

The present invention provides an amplitude modulator, which is disposed in an area through which a magnetic field flows so as to modulate amplitudes, comprising: a substrate; a first driving electrode which receives a first frequency signal and a second frequency signal supplied from the substrate and carries out resonant motion by the magnetic field; and a second driving electrode for receiving the second frequency signal and carries out resonant motion by the first driving electrode and the magnetic field, wherein a modulated signal is generated by modulating the amplitudes of the first and second frequency signals through the resonant (Continued)

motions of the first and second driving electrodes. Therefore, since the signal generated by modulating a carrier signal through mechanical resonance according to the magnetic field is outputted, amplitude modulation can be carried out without a complicated circuit configuration. In addition, since an MEMS device is a single structure that does not include an insulating layer, a single signal is applied to one structure, thereby simplifying driving, and all the driving electrodes of both ends thereof are driven so as to double a change in variable capacitance, thereby improving sensing ability.

10 Claims, 9 Drawing Sheets

(51) Int. Cl.
G01R 33/00 (2006.01)
G01R 33/06 (2006.01)
G01R 33/02 (2006.01)
G01R 33/028 (2006.01)
G01R 33/038 (2006.01)

(52) U.S. Cl.
CPC ....... *G01R 33/0286* (2013.01); *G01R 33/038* (2013.01); *G01R 33/06* (2013.01)

(58) Field of Classification Search
CPC . H02J 50/40; H02J 50/60; H02J 50/90; H04B 5/0031; H04B 5/0037; H04B 13/02; H04B 1/38; H04B 1/3827; H04B 5/0062; H04B 5/0075; H04B 5/02; H04W 84/18; H04W 4/008; H04W 4/026; G01R 33/06; G01R 33/02; G01R 33/0052; G01R 33/0286; H03C 1/46; H01L 21/0366
USPC ....... 73/777; 455/333, 303, 323; 331/116 M; 332/149, 150, 163, 164; 438/52
See application file for complete search history.

(56) References Cited

FOREIGN PATENT DOCUMENTS

| KR | 20070011670 A | 1/2007 |
| KR | 1020110113847 A | 10/2011 |
| KR | 101262606 B1 | 5/2013 |

* cited by examiner

【Fig. 1】
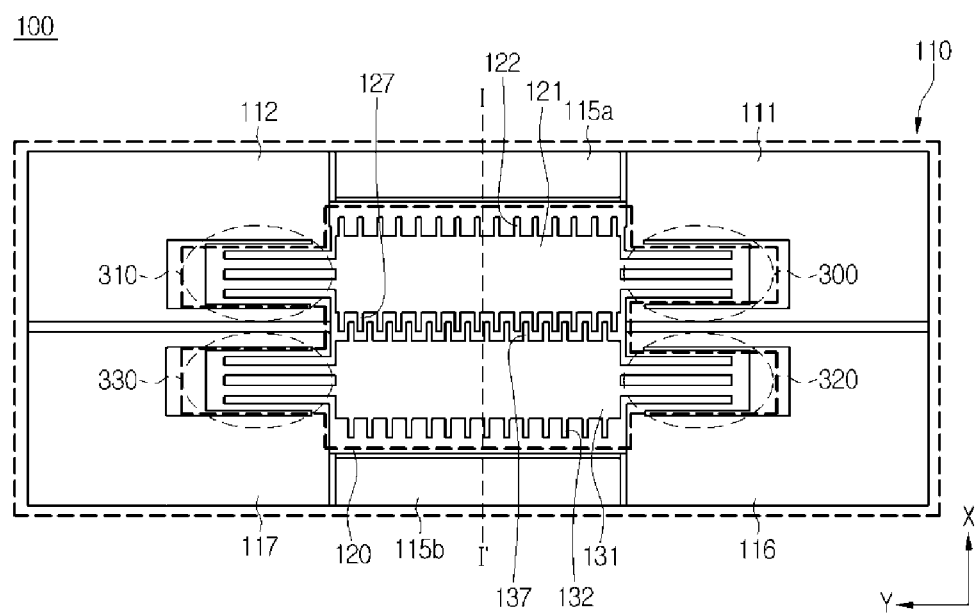

【Fig. 2】
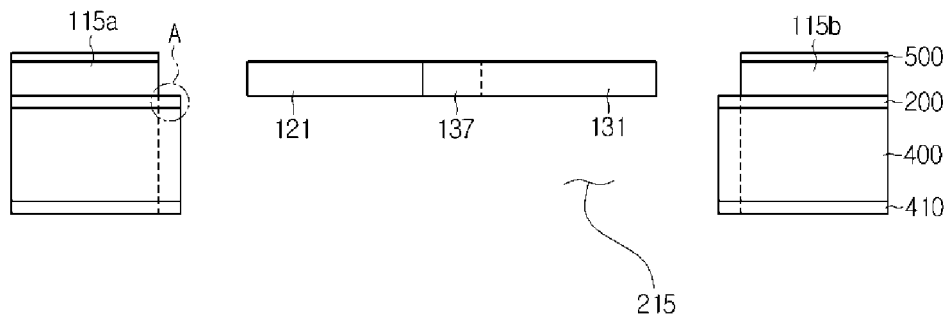
【Fig. 3】
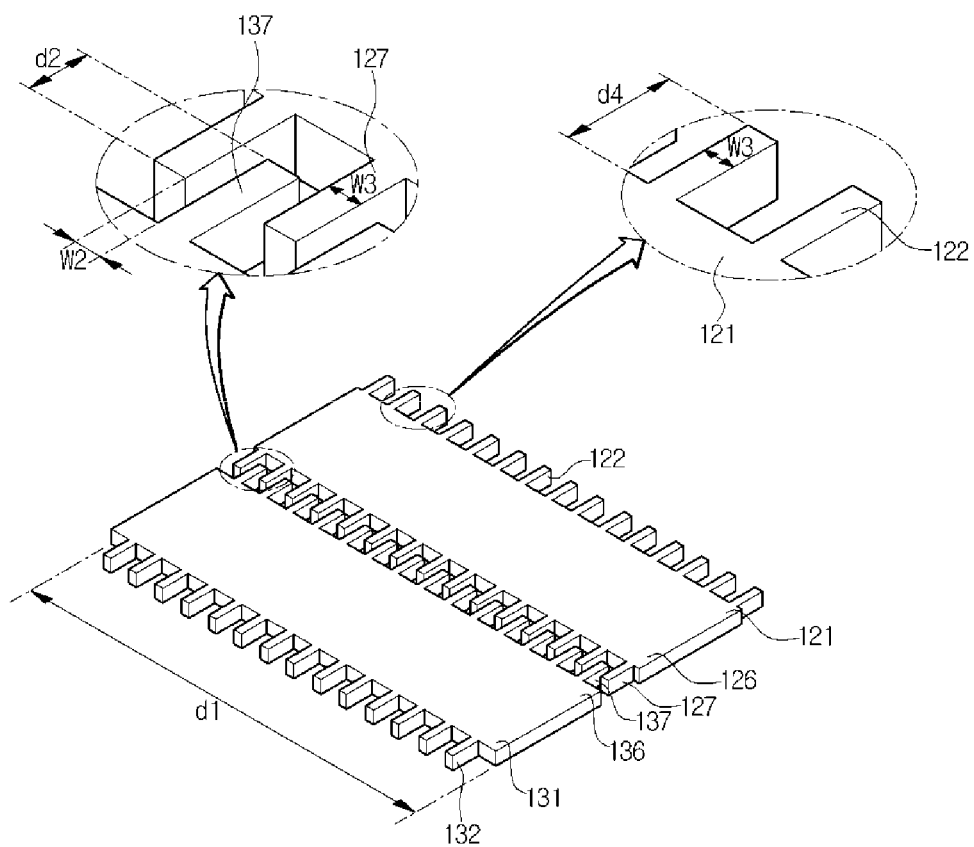

【Fig. 4】
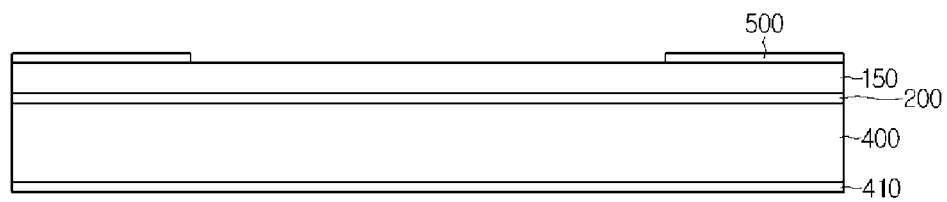
【Fig. 5】
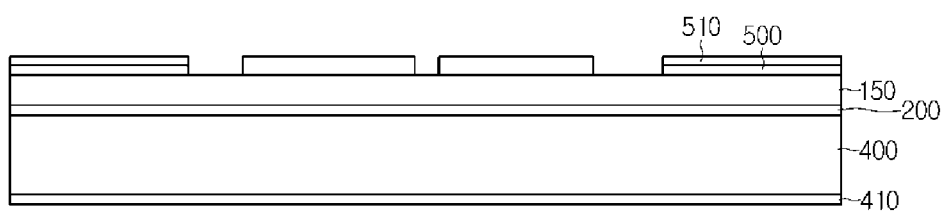
【Fig. 6】
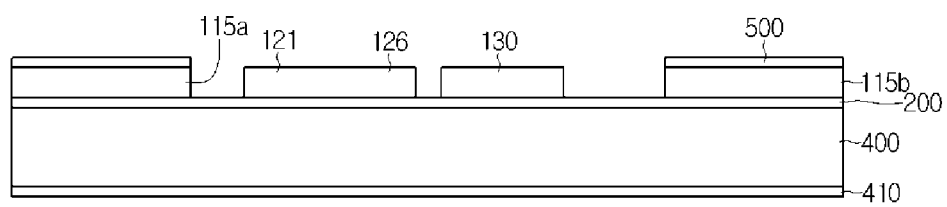
【Fig. 7】
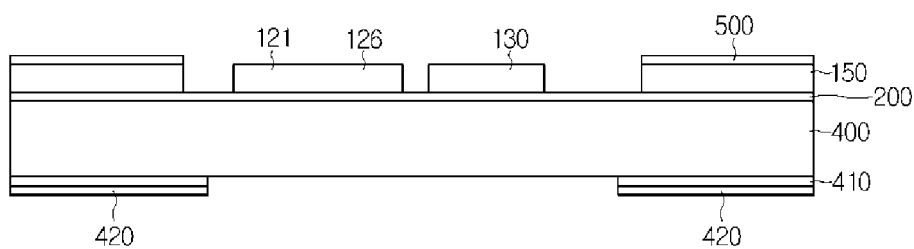

【Fig. 8】
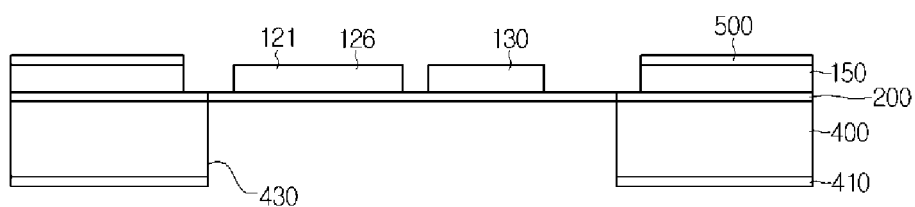
【Fig. 9】
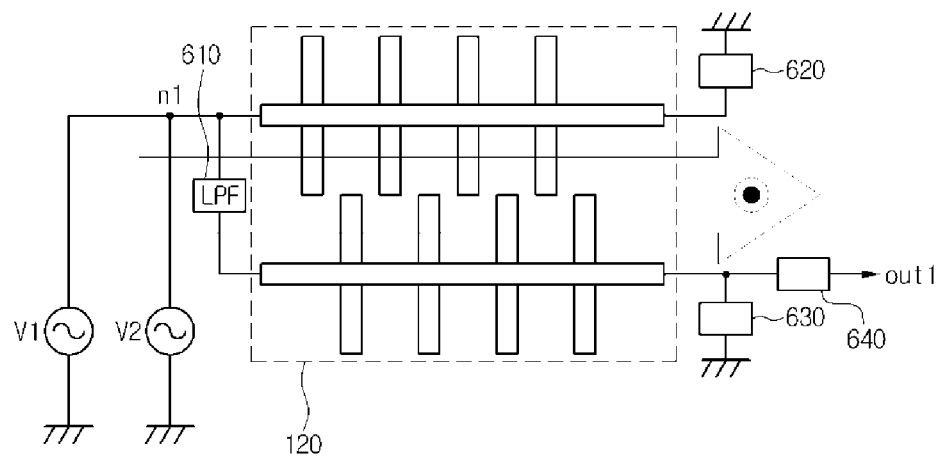

[Fig. 10]
(a)
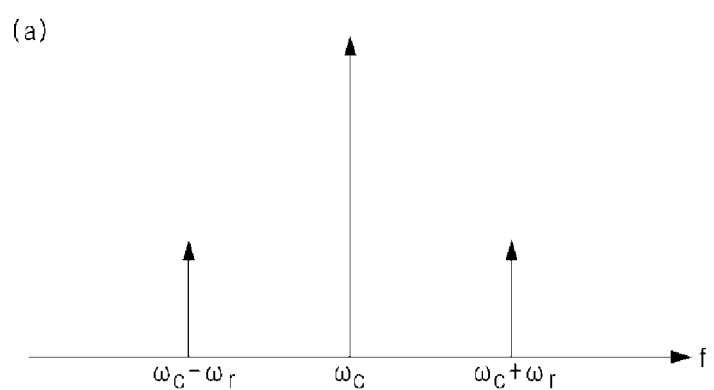
(b)
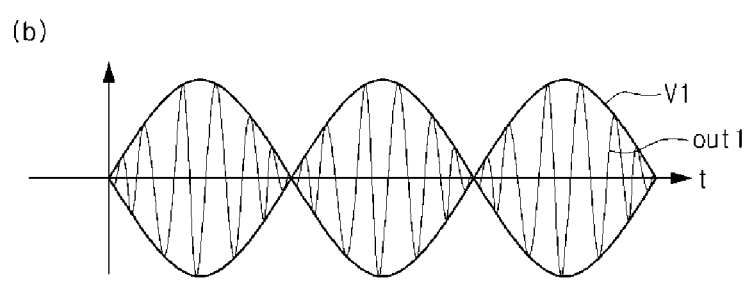

【Fig. 11】
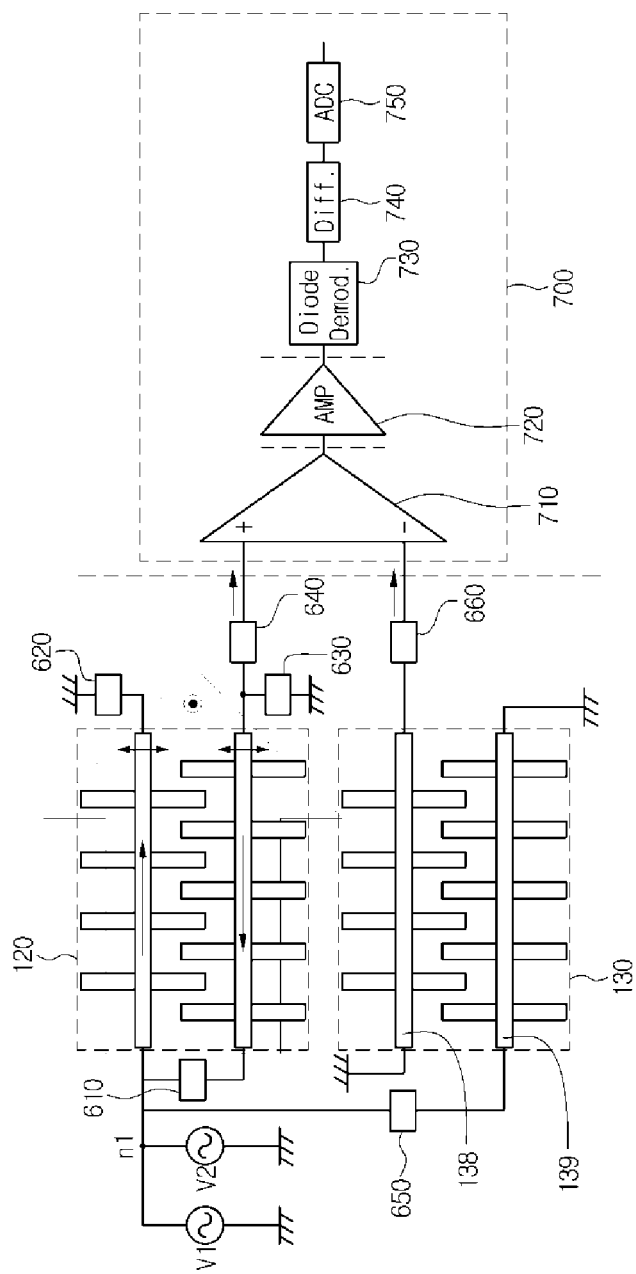

【Fig. 12】
(a)
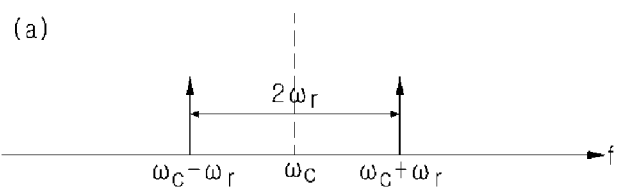
(b)
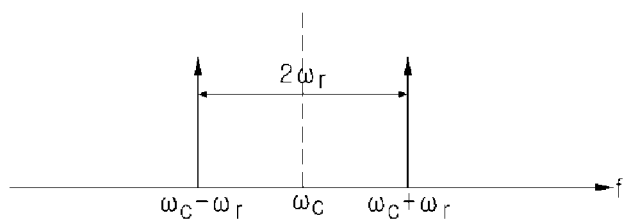
(c)
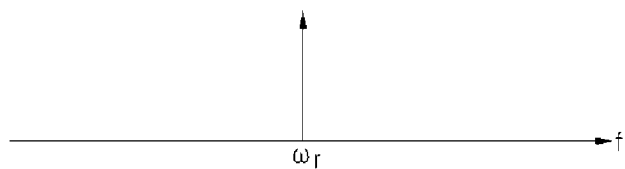
(d)
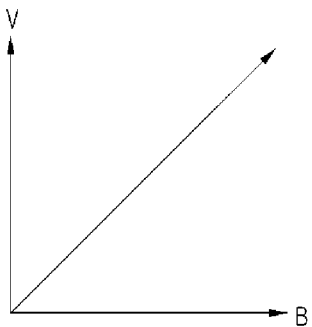

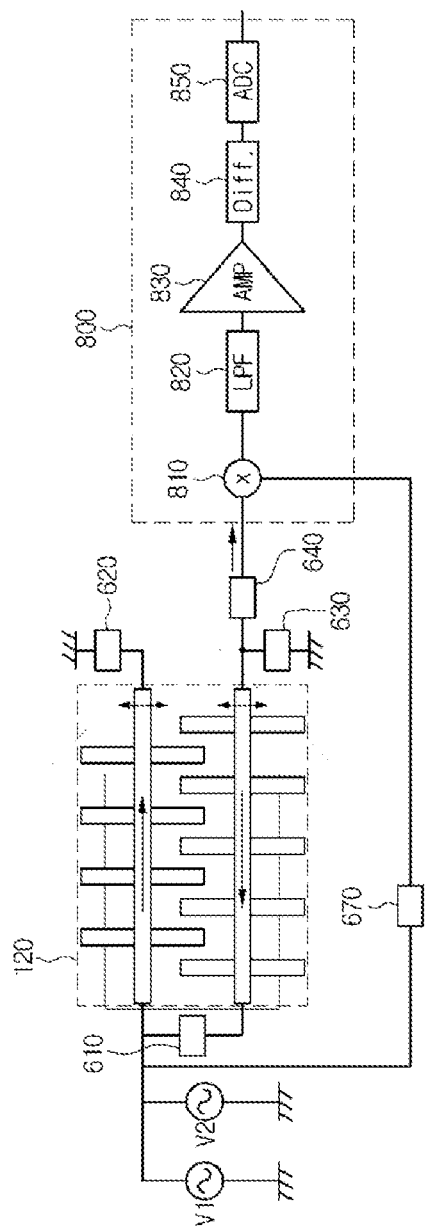
[Fig. 13]

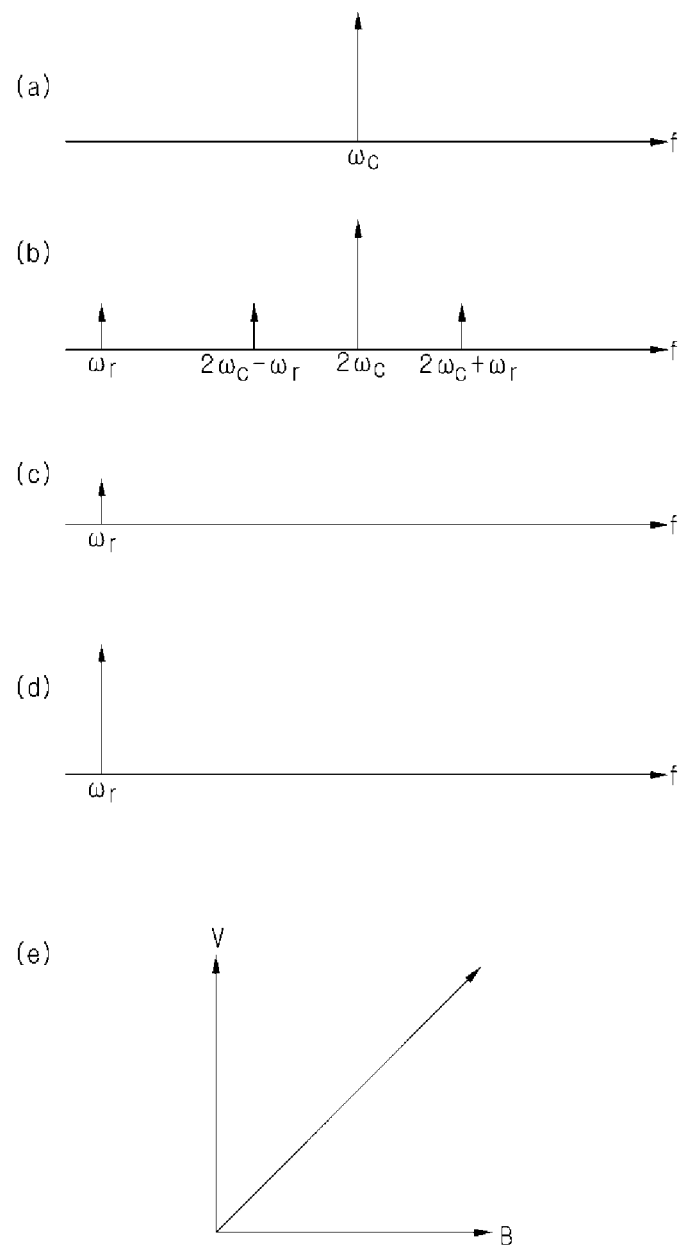
[Fig. 14]

MEMS AMPLITUDE MODULATOR AND MEMS MAGNETIC FIELD SENSOR INCLUDING SAME

CROSS-REFERENCE TO RELATED APPLICATION

This application is the U.S. national stage application of International Patent Application No. PCT/KR2014/007246, filed Aug. 5, 2014, which claims priority to Korean Application No. 10-2013-0099298, filed Aug. 21, 2013, the disclosures of each of which are incorporated herein by reference in their entirety.

TECHNICAL FIELD

The embodiment relates to a microelectromechanical system (MEMS) amplitude modulator and a MEMS magnetic field sensor including the same.

BACKGROUND ART

In general, a magnetic field sensor based on a MEMS capacitive sensing technique includes a driving electrode movable in response to a magnetic field and a fixed electrode able to sense a capacitive variation corresponding to the movement of the driving electrode.

According to the magnetic field sensor principle, when reference current flows into the driving electrode in a predetermined direction, the driving electrode moves in a positive or negative direction to the fixed electrode due to Lorentz force according to the direction and intensity of magnetic field introduced from an outside.

In this case, a distance between both electrodes and an overlapped area of both electrodes are changed so that capacitance is changed. Thus, by detecting the variation in capacitance or a signal varying corresponding to the variation in capacitance, the magnetic field is sensed.

However, since Lorentz force utilized to sense a magnetic field is very small relative to gravity, there is a limitation on designing a structure of a sensor such as a spring, so that it is difficult to obtain a sufficient mechanical displacement.

In addition, when a signal, which is varied while AC or DC current is applied to the driving electrode for driving, is detected, it is not easy to detect a desired signal due to a mixing of currents

DISCLOSURE

Technical Problem

The embodiment provides a MEMS amplitude modulator having an improved sensing function and a MEMS magnetic field sensor including the same.

Meanwhile, the objects accomplished by the embodiments may not be limited to the above objects, and those skilled in the art may clearly understand other objects from following description.

Technical Solution

According to the embodiments, there is provided an amplitude modulator disposed on an area through which a magnetic field flows to modulate an amplitude,
the amplitude modulator including:
a substrate; a first driving electrode to receive first and second frequency signals supplied from the substrate and resonate due to the magnetic field; and a second driving electrode that receives the second frequency signal and carries out resonant motion with the first driving electrode due to the magnetic field, wherein the first and second frequency signals are amplitude-modulated by the resonant motion of the first and second driving electrodes to generate an amplitude modulated signal.

Advantageous Effects

According to the MEMS amplitude modulator of the embodiment, when a carrier signal and a driving signal of a resonance frequency are simultaneously applied, a signal modulated with the carrier signal due to the mechanical resonance is output, so that it is possible to perform an amplitude modulation without configuring a complex circuit.

In addition, the MEMS device is a single structure does not including any insulating layers and is driven by applying a single signal thereto, so that the driving of the MEMS device is simple. In addition, all the driving electrodes on both ends of the MEMS device are driven so that the amount of variation in the variable capacitance thereof is increased twice, thereby improving the sensing function.

In addition, when the MEMS device is used as a magnetic field sensor through various signal detection schemes, the output modulated signal may be processed to detect the intensity of a magnetic field.

DESCRIPTION OF DRAWINGS

FIG. 1 is a top view showing an amplitude modulator according to a first embodiment.

FIG. 2 is a sectional view taken along line I-I' of the amplitude modulator shown in FIG. 1.

FIG. 3 is an enlarged view showing a driving electrode of the amplitude modulator shown in FIG. 1.

FIGS. 4 to 8 are sectional views illustrating a method of manufacturing the amplitude modulator shown in FIG. 1.

FIG. 9 is a view illustrating a principle of driving the amplitude modulator shown in FIG. 1.

FIG. 10 is a waveform diagram showing output signals of FIG. 9 in frequency and time domains.

FIG. 11 is a view illustrating one example of applying the amplitude modulator of FIG. 1 to a magnetic field sensor.

FIG. 12 is a waveform diagram illustrating each stage of the magnetic field sensor shown in FIG. 11.

FIG. 13 is a view illustrating another example of applying the amplitude modulator of FIG. 1 to a magnetic field sensor.

FIG. 14 is a waveform diagram illustrating each stage of the magnetic field sensor shown in FIG. 13.

BEST MODE

Mode of the Invention

Hereinafter, the exemplary embodiment of the present invention will be described with reference to the accompanying drawings. However, the present invention is not limited to the exemplary embodiment described below, but can be implemented in various forms.

In the following description, when a predetermined part "includes" a predetermined component, the predetermined part does not exclude other components, but may further include other components unless otherwise indicated.

The embodiment provides an amplitude modulator to which a microelectromechanical system (MEMS) device having an enlarged mechanical displacement is applied and a magnetic field sensor including the same.

Hereinafter, an amplitude modulator according to the embodiment will be described with reference to FIGS. 1 to 3.

FIG. 1 is a top view showing an amplitude modulator according to a first embodiment. FIG. 2 is a sectional view taken along line I-I' of the amplitude modulator shown in FIG. 1. FIG. 3 is an enlarged view showing a driving electrode of the amplitude modulator shown in FIG. 1.

Referring to FIG. 1, the amplitude modulator according to the embodiment, which is a microelectromechanical system (MEMS) device, includes a fixing substrate 110, a driving electrode unit 120, and a plurality of elastic units 300 to 330.

The MEMS device refers to a technique of fabricating a micromechanical structure such as a very large scale integrated circuit, micro-gears or a hard disk by processing silicon, quartz or glass. A micro-machine fabricated through a MEMS technique has the precision of micrometer-scale (1/1,000,000 meters) or less. In terms of structure, the semiconductor microfabrication technology which repeats deposition and etching processes is applied and a principle of generating current using the electrostatic force, which is an attractive force between electric charges, and surface tension to greatly reduce the power consumption is applied for the driving power.

In the MEMS amplitude modulator including such a MEMS device, the fixing substrate 110 supports the driving electrode unit 120 and the elastic units 300 to 330.

The fixing substrate 110 may have a flat shape or a rectangular-frame shape. The fixing substrate 110 may have an elongated rectangular shape and an area of 3 mm$^2$×1 mm$^2$.

The fixing substrate 110 may have a multilayered structure. As shown in FIG. 2, the fixing substrate 110 may include a support substrate 400, an insulating layer 200 of the support substrate 400 and electrode layers 115a and 115b on the insulating layer 200.

The support substrate 400 may be a silicon substrate, a glass substrate or a polymer substrate. In the first embodiment, the silicon substrate is used as the support substrate 400.

The support substrate 400 may have a thickness in the range of 100 μm to 500 μm. Preferably, the support substrate 400 may have a thickness of 400 μm.

The insulating layer 200 is formed on the support substrate 400.

When the support substrate 400 is a silicon substrate, the insulating layer 200 may be formed of silicon oxide or silicon nitride and have a thickness in the range of 1 μm to 1.5 μm.

An electrode layer 115 is formed on the insulating layer 200.

The fixing substrate includes a plurality of electrodes 111, 112, 116 and 117 formed by patterning the electrode layer 115 on the support substrate 400, which has a cavity 215 containing the driving electrode unit 120 at a central portion of the cavity 215, such that the electrodes 111, 112, 116 and 117 are disposed on the fixing substrate 110 along each side of the rectangular-shaped fixing substrate 110 while being spaced apart from each other.

The electrodes 111, 112, 116 and 117 may include a conductive material such as silicon, copper, aluminum, molybdenum or tungsten. Preferably, when the support substrate 400 is a silicon substrate, the electrodes 111, 112, 116 and 117 are formed of silicon. The electrodes 111, 112, 116 and 117 may have a thickness in the range of 10 μm to 100 μm. Preferably, the electrodes 111, 112, 116 and 117 have about 50 μm.

The electrodes 111, 112, 116 and 117 may be electrically separated from each other and may include two power electrodes 112 and 117 and two sensing electrodes 111 and 116 corresponding to the power electrodes 112 and 117, which are disposed on four edge areas.

In more detail, the first and second power electrodes 112 and 117 are disposed on a straight line along an x-axis on the edge areas, the first sensing electrode 111 is disposed is disposed on the edge area while facing the first power electrode 112 in the y-axis direction, and the second sensing electrode 116 is disposed on the edge area while facing the second power electrode 117 in the y-axis direction.

Although the electrodes 111, 112, 116 and 117 are formed on the edge areas in the embodiment, the embodiment is not limited thereto and the condition is satisfied if the electrodes 111, 112, 116 and 117 are spaced apart from each other while being connected to the driving electrode unit 120.

The first power and sensing electrodes 112 and 111 are spaced apart from each other by a predetermined distance. When the predetermined distance is in a predetermined range or more, as shown in FIG. 1, a dummy electrode 115a may be further formed between both electrodes 112 and 111.

When the dummy electrode 115a is formed, the dummy electrode 115a has a width less than those of both electrodes 112 and 111 in the x-axis direction.

The second power and sensing electrodes 117 and 116 are spaced apart from each other by a predetermined distance. When the predetermined distance is in a predetermined range or more, as shown in FIG. 4, a dummy electrode 115b may be further formed between both electrodes 117 and 116.

When the dummy electrode 115b is formed, the dummy electrode 115b is formed to have a width narrower than those of the electrodes 117 and 116.

When the dummy electrodes 115a and 115b are formed, respectively, as shown in part A of FIG. 2, the support substrate 400 below the dummy electrodes 115a and 115b may be formed to protrude toward the cavity 215 and may be equal to or less than the dummy electrodes 115a and 115b.

The widths of the dummy electrodes 115a and 115b may be controlled to expose the support substrate 400 to side surfaces constituting the cavity 215, so that the dummy electrodes 115a and 115b and the electrodes 111, 112, 116 and 117 may be prevented from being short circuited with each other.

The electrodes 111, 112, 116 and 117 include small cavities connected to the driving electrode unit 120, respectively. Elastic units 300 to 330 are disposed in the small cavities, respectively.

In this case, a metal layer 500 may be formed on the electrodes 111, 112, 116 and 117.

The metal layer 500 is formed of a high-conductive material such as copper, aluminum, molybdenum, tungsten or silver. When the electrode layers are formed of silicon, the metal layer 500 is formed of a material having electric conductivity greater than that of silicon.

As described above, since the high-conductive material is further formed on the electrode areas, the current diffusion may be smoothly performed so that the reaction rate may be increased.

The driving electrode unit 120 is disposed in the cavity of the fixing substrate 110.

The driving electrode unit 120 includes a first driving electrode 121 surrounded by the first sensing electrode 111 and the power electrode 112 to receive electric power, and a second driving electrode 131 surrounded by the second sensing electrode 116 and the second power electrode 117.

The first driving electrode 121 includes a body extending along a y-axis in the cavity 215, an expansion surface expanding from both long side surfaces of the body, and an electrode piece protruding from the expansion surface.

The first driving electrode 121 is formed of an electrode layer extending from two elastic units 300 and 310.

The body of the first driving electrode 121 is formed in a type of a bar connecting the first and second elastic units 300 and 310 to each other.

The expansion surface expands in an x-axis direction from two long sides of the body. The expansion signifies an expansion into the space by a step difference formed in the x-axis direction between the first power electrode 112 and the dummy electrode 115a.

A length d1 of the first driving electrode 121 is in the range of 500 μm to 5000 μm or preferably, in the range of 1500 μm to 2500 μm.

The first driving electrode 121 includes a plurality of first reference electrode pieces 122 protruding toward the dummy electrode 115a and a plurality of first driving electrode pieces 127 protruding toward the second driving electrode 131.

The first reference electrode piece 122 and the first driving electrode piece 127 may be formed in a comb shape. The first reference electrode piece 122 having a predetermined length d4 may has a width W3 in the range of 1 μm to 30 μm or preferably, 3 μm to 4 μm.

The numbers of the first reference electrode pieces 122 and the first driving electrode pieces 127 are determined according to the length dl of the first driving electrode 121, the width W3 of the first reference electrode piece 112 and a spaced distance between them.

The first reference electrode pieces 122 and the first driving electrode pieces 127 are the same shape and disposed to be symmetrical to each other with respect to the body. Thus, the first driving electrode 121 may maintain center of gravity in the x-axis direction.

Meanwhile, the second driving electrode 131 has the same configuration as that of the first driving electrode 121, and includes a body extending in the cavity 215 in the y-axis direction, an expansion surface expanding from both long side surfaces of the body, and an electrode piece protruding from the expansion surface.

The second driving electrode 131 is formed of an electrode layer extending from two elastic units 320 and 330.

The body of the second driving electrode 121 is formed in a type of a bar connecting the third and fourth elastic units 320 and 330 to each other.

The expansion surface expands from two long sides of the body in an x-axis direction. The expansion signifies an expansion into the space by a step difference formed in the x-axis direction between the second power electrode 117 and the dummy electrode 115b.

The second driving electrode 131 includes a plurality of first reference electrode pieces 132 protruding toward the dummy electrode 115b and a plurality of first driving electrode pieces 137 protruding toward the first driving electrode 137.

The second reference electrode piece 132 and the second driving electrode piece 137 may be formed in a comb shape, and have the same shape as that of the first driving electrode 121.

The second reference electrode pieces 132 and the second driving electrode pieces 137 are the same shape and disposed to be symmetrical to each other with respect to the body. Thus, the second driving electrode 131 may maintain the center of gravity in the x-axis direction.

The first and second driving electrode pieces 127 and 137 cross each other.

The electrode pieces of the first and second driving electrodes 121 and 131 faces each other on the central area of the magnetic field sensor to form a variable capacitor.

Since the first driving electrode piece 127 of the first driving electrode 121 and the second driving electrode piece 137 of the second driving electrode 131 are disposed to cross each other, the capacitance of the variable capacitor is varied according to the area of the crossing pieces 127 and 137.

Although the variable capacitor is implemented with a comb drive which is a comb-shaped driver in the embodiment, the embodiment is not limited thereto and the variable capacitor may be implemented in various structures such as a structure using a distance difference between opposite pieces.

The first and second driving electrode pieces 127 and 137 have an overlap distance d2 of about 30 μm in a state that any voltages are not applied to the first and second power electrode 112 and 117 or Lorenz force is not generated.

The spaced distance W2 between one of the first driving electrode pieces 127 and the second driving electrode piece 137 adjacent thereto may be in the range of 1 μm to 10 μm or preferably, 2 μm to 3 μm.

Meanwhile, the amplitude modulator includes the first and second elastic units 300 and 310 for connecting the fixing substrate 110 to the first driving electrode 121 and the third and fourth elastic units 320 and 330 for connecting the fixing substrate 110 to the second driving electrode 131.

The elastic units 300 to 330 connect both ends of each driving electrodes 121 and 131 to the reference electrodes 112 and 117 or the sensing electrodes 111 and 116.

The first to fourth elastic units 300 to 330 each may be formed of a spring of a double folded type and may be formed to have four legs as shown in FIG. 1.

The first to fourth elastic units 300 to 330 may be disposed in the small cavities formed by the reference electrodes 112 and 117 and the sensing electrodes 111 and 116, respectively.

The first elastic unit 300 is disposed in the small cavity formed by the first sensing electrode 111 and the second elastic unit 310 is disposed in the small cavity of the first reference electrode 112. In addition, the third elastic unit 320 is disposed in the small cavity formed by the second sensing electrode 116 and the fourth elastic unit 330 is disposed in the small cavity formed by the second reference electrode 117.

The second and first elastic units 310 and 300 are connected to both ends of the first driving electrode 121, respectively such that the first reference electrode 112 and the first sensing electrode 111 are connected to each other.

The fourth and third elastic units 330 and 320 are connected to both ends of the second driving electrode 131, respectively such that the second reference electrode 117 and the second sensing electrode 116 are connected to each other.

The four elastic units 300 to 330 may include the same number of legs and be formed on both ends of the driving electrode unit 120 of the amplitude modulator 100 while facing each other to distribute tension.

In addition, the elastic units may be symmetrical to each other, so that they may be balanced with each other on the whole, thereby securing device reliability.

The four elastic units 300 to 330 are formed of an electric layer 500 exclusively to accomplish the physical and electrical connection of each element, and provide restoring force by elastic force after each element is driven.

In addition, the four elastic units 300 to 330 have the same configuration and the metal layer 500 extending from the electrodes of the fixing substrate 110 are formed on all the elastic units 300 to 330 to increase the electrical conductivity of the elastic units 300 to 330.

Hereinafter, a method of manufacturing the amplitude modulator of FIG. 1 will be described with reference to FIGS. 4 to 8.

As shown in FIG. 4, a pattern is formed on a base substrate by using the metal layer 500.

The base substrate has a structure in which an insulating layer 200 and an electrode layer 150 are formed on the support substrate 400.

The support substrate 400 may have a thickness in the range of 300 μm to 500 μm or preferably, a thickness of 400 μm.

When the support substrate 400 is a silicon substrate, the insulating layer 200 may be formed of silicon oxide or silicon nitride and have a thickness of about 1.5 μm.

The electrode layer 150 may include a conductive material such as silicon, copper, aluminum, molybdenum or tungsten. Preferably, when the support substrate 400 is a silicon substrate, the electrode layer 150 may be formed of silicon. The electrode layer 150 may have a thickness in the range of 10 μm to 100 μm or preferably, about 50 μm.

That is, the electrode layer 150 may be a silicon substrate including the silicon insulating layer 200 therein and an external insulating layer 410 may be formed below the support substrate 400.

The external insulating layer 410 may be a silicon oxide layer or a silicon nitride layer having a thickness of about 1.5 μm.

A metal layer 500 is formed on the electrode layer 150 and a plurality of patterns is formed by patterning the metal layer 500.

The pattern, which is a metal pattern on the electrode layer 150 for increasing electrical conductivity in FIG. 1, may be formed on the reference electrodes 112 and 117 of the fixing substrate 110, the sensing electrodes 111 and 116, the elastic units 300 to 330, and a part of the body of the driving electrode unit 120.

Next, as shown in FIG. 5, a mask 510 is formed on the metal pattern and the electrode layer 150 to etch the electrode layer 150 according to a design so that the electrode, the electrode piece and the spring are formed, respectively.

In detail, after forming a photomask on the metal pattern and the electrode layer 150, the electrode layer 150 exposed through the photomask 510 is removed so that the patterns may be formed as shown in FIG. 6.

In this case, a reactive ion etching (ME) process may be performed as the etching process.

After removing the mask pattern 510, as shown in FIG. 7, a photomask 420 is formed on the external insulating layer 410 to pattern the photomask and then, as shown in FIG. 8, the support substrate 400 is removed.

In detail, after the photomask 420 is formed on the external insulating layer 410 on the support substrate 400, the external insulating layer 410 is patterned such that only the external insulating layer 410 below the fixing substrate 110 remains. Thereafter, the photomask 420 is formed only below the fixing substrate 110 and the exposed support substrate 400 is removed by etching the exposed support substrate 400 to the exposed insulating layer 200.

In this case, before processing the lower part, to protect the upper pattern, a protective layer (not shown) may be formed on the upper part.

Next, as shown in FIG. 2, the driving electrode unit 120 is floated by etching the internal silicon insulating layer 200 according to a design.

In this case, the etching of the internal silicon insulating layer 200 may be performed through a gas plasma etching scheme by using fluorine oxide gas.

The amplitude modulator, which is a MEMS device formed as described above, is fixed by the spring while maintaining the floating state of driving electrode unit 120 may be operated for the purpose of magnetic field sensing.

Hereinafter, the operation of the amplitude modulator of FIG. 1 will be described with reference to FIGS. 9 and 10.

FIG. 9 is a view illustrating a principle of driving the amplitude modulator shown in FIG. 1. FIG. 10 is a waveform diagram showing output signals of FIG. 9 in frequency and time domains.

Referring to FIG. 9, the amplitude modulator 100 according to the embodiment physically resonates by a peripheral magnetic field and modulates two signals applied through one end thereof to output a modulated signal through the other end thereof.

The amplitude modulation may be implemented by a peripheral circuit shown in FIG. 9.

In detail, the amplitude modulator 100 receives a reference signal V1 and a measurement signal V2 through a first node n1.

In this case, the reference signal V1 may be a sine wave AC signal having a frequency equal to the physical resonance frequency of the amplitude modulator 100.

The frequency of the reference signal V1 is represented as ωr.

Meanwhile, the measurement signal V2 may be a sine wave AC signal having a frequency higher than that of the reference signal V1.

When the measurement signal V2 is represented as ωc, the frequency of the measurement signal V2, which is 1,000 times higher than the frequency of the reference signal, may be set to have a ratio sufficient to perform the filtering through a low-pass filter 610.

The first reference electrode 112 of the fixing substrate 110 is operated as the first node n1 and the first reference signal V1 and the measurement signal V2 are simultaneously applied to the first reference electrode 112.

The second reference electrode 117 connected to the second driving electrode 131 receives only the reference signal V1.

The second reference electrode 117 may be connected to the first node n1 through the low-pass filter 610 to filter the measurement signal V2 and may receive only the reference signal V1 to apply the reference signal V1 to the second driving electrode 131.

In this case, the reference signal V1 applied to the second driving electrode 131 is a reference signal V1 of which the phase is delayed by 180 degrees, and the low-pass filter 610 may be operated as a delay to allow the reference signal V1 having the opposite phase to be applied to the both electrodes 121 and 131.

The opposite ends of the first and second driving electrodes 121 and 131, that is, the first and second sensing electrodes 111 and 116 may be connected to the ground and inductors 620 and 630 may be connected between the ground and the sensing electrodes 111 and 116.

In design, the inductors 620 and 630 may be set to have an impedance of at least 1/10 times of the impedances of the driving electrodes 121 and 131.

When the inductors 620 and 630 are connected as described above, the measurement signal V2 is protected from by-passing from the driving electrodes 121 and 131 to the ground, so that the structure may be stably operated.

In addition, the signal-to-noise ratio (SNR) may be improved by by-passing a low frequency noise into the ground.

The second sensing electrode 116 includes a high-pass filter 640 connected in parallel to the inductors 620 and 630 and outputs an output signal out1 through the high-pass filter 640.

The high-pass filter 640 may be implemented with a capacitor and blocks the resonant signal having a frequency lower than a blocking frequency to allow only the measurement signal V2 to flow and prevent the reference signal V1 from flowing therethrough, so that only a desired signal is output to the output end through the high-pass filter 640.

When the reference voltage V1 having the same frequency as the physical resonance frequency of the amplitude modulator 100 is applied to both ends of the amplitude modulator 100 disposed in the environment in which a specific magnetic field is formed, the driving electrodes placed at both sides resonate with each other at the period of the resonance frequency having an inverted phase due to Lorentz force caused by excitation in the magnetic field.

Thus, while it is repeated that the overlap area of the electrode pieces 127 and 137 of both driving electrodes 121 and 131 is increased and decreased, variable capacitance is formed and generated in proportion to the intensity of the magnetic field.

In this case, when the measurement signal V2 having a high frequency is applied only to the first driving electrode 121, the measurement signal V2 modulated into the reference signal V1 flows through the second driving electrode 131 due to the physical resonance.

That is, the waveform of such a signal is shown in FIG. 10b.

The modulated measurement signal V2 enveloped in the reference signal V1 flows through the second driving electrode 131.

The reference signal V1 defined as noise among the modulated measurement signal V2 is blocked by the high-pass filter 640 and only the modulated measurement signal V2 of FIG. 10b is output to the output terminal.

Thus, as shown in FIG. 10a, through the amplitude modulator 100, a waveform having ($\omega c \pm \omega r$) with respect to the frequency $\omega c$ of the measurement signal V2, that is, an output signal out1 of $\cos(\omega ct)+\sin(\omega ct\pm\omega rt)$ may be obtained.

As described above, the amplitude modulation may be enabled by the simple structure, so that it is possible to avoid a complex circuit configuration, so the embodiment is economical.

Hereinafter, a magnetic field sensor to which the amplitude modulator 100 is applied will be described with reference to FIGS. 11 and 12.

FIG. 11 is a view illustrating one example of applying the amplitude modulator of FIG. 1 to a magnetic field sensor. FIG. 12 is a waveform diagram illustrating each stage of the magnetic field sensor shown in FIG. 11.

Referring to FIG. 11, the magnetic field sensor to which the amplitude modulator 100 is applied may sense intensity of a magnetic field from the modulated output signal out1.

The magnetic field sensor includes a driving electrode unit 120, a reference signal V1, a measurement signal V2, a low-pass filter 610, inductors 620 and 630 and a high-pass filter 640.

A peripheral configuration of the driving electrode unit 120 is the same as that shown in FIG. 9.

Meanwhile, the magnetic field sensor of FIG. 11 may further include a comparison electrode unit 130 having the same configuration as that of the driving electrode unit 120.

The comparison electrode unit 130 may have physical characteristics the same as those of the driving electrode unit 120 and may include a first comparison electrode 138 and a second comparison electrode 139 facing the first comparison electrode 138.

One end of the first comparison electrode 138 is grounded and the opposite end outputs a comparison signal through a resistor 660.

One end of the second comparison electrode 139 is connected to a first node n1 through the high-pass filter 650 and receives only a measurement signal V2 through the first node n1.

In the comparison electrode unit 130, both electrode pieces form a capacitor to be operated as a high-pass filter such that the measurement signal V2 applied to the second comparison electrode 139 is transmitted to the first comparison electrode 138.

Thus, the high frequency measurement signal V2 is output through the resistor 660 as the comparison signal.

The resistor 660 may control the amplitude of the comparison signal output from the comparison electrode unit 130 and may constantly maintain an input level of a comparator which will be described below in order to reduce the output level of the comparison electrode unit 130 rather than the output of the driving electrode unit 120. In addition, a noise having a frequency higher than that of the comparison signal of the comparison electrode unit 130 may be blocked so that a high frequency noise is blocked.

The magnetic field sensor further includes a reading unit 700 connected to the driving electrode 120 and the comparison electrode unit 130 to sense the intensity of a magnetic field based on the output signal out1 and the comparison signal.

As shown in FIG. 11, the reading unit 700 may include a comparator 710, an amplifier 720, a demodulator 730, a differentiator 740 and a converter 750.

The comparator 710 has an inverting input terminal and a non-inverting input terminal and offsets the input signals of the inverting input terminal and the non-inverting input terminal against each other to output a remaining signal.

The output signal out1 is input from the second driving electrode 131 of the driving electrode unit 120 to the non-inverting input terminal and the comparison signal is input from the first comparison electrode 138 of the comparison electrode unit 130 to the inverting input terminal.

The comparator 710 offsets the high frequency signal value of the inverted comparison signal and the high frequency signal vale of the comparison signal against each other to output a low frequency signal value shown in FIG. 12a.

That is, the value of the high frequency we disposed at the center of FIG. 10a is offset from the output signal value so that only values of $\omega c \pm \omega r$ at both sides remain.

The amplifier 720 receives the signals and amplifies the values of the signals to output the signals having the amplified values shown in FIG. 12b.

When the output signal out1 of the comparator 710 is low, an external signal having a low noise value may be recognized as the reference signal V1. Thus, to prevent the external signal having a low noise value from being recognized as the reference signal V1, the value of the output signal out1 of the comparator 710 is amplified through the amplifier 720 having a high gain to have a turn-on voltage or higher of a diode of the demodulator 703.

Thus, the reduction of an S/N ratio caused due to non-linearity of the diode is previously compensated by removing unnecessary harmonics.

The amplifier 720 may be omitted.

The demodulator 730, which is a diode demodulator including a diode, converts the reference value of the signal value into 0 (zero) to demodulate the value of ωr.

Thus, the output signal out1 of the demodulator 730 has a pulse signal having the frequency ωr as shown in FIG. 12.

When the pulse signal is transformed into a time domain signal, the pulse signal becomes a low frequency sine wave signal.

When the differentiator 740 differentiates the pulse signal, a graph of a voltage to intensity of a magnetic field may be obtained as shown in FIG. 12d.

The converter 705 converts the voltage value to the magnetic field intensity output from the differentiator 740 such that an A/D signal may be output corresponding to target magnetic field intensity B.

Therefore, the target magnetic field intensity may be read out according to the output value.

When the reading unit 700 is formed by applying the comparator 710 as described above, only the high frequency measurement signal V2 may be selectively applied to the inverting input terminal.

Hereinafter, a magnetic field sensor according to another embodiment will be described with reference to FIGS. 13 and 14.

FIG. 13 is a view illustrating another example of applying the amplitude modulator of FIG. 1 to a magnetic field sensor. FIG. 14 is a waveform diagram illustrating each stage of the magnetic field sensor shown in FIG. 13.

Referring to FIG. 13, the magnetic field sensor to which the amplitude modulator 100 is applied according to another embodiment may sense intensity of a magnetic field from the modulated output signal out1.

The magnetic field sensor includes a driving electrode unit 120, a reference signal, a measurement signal V2, a low-pass filter 610, inductors 620 and 630 and a high-pass filter 640.

A peripheral configuration of the driving electrode unit 120 is the same as that shown in FIG. 9.

Meanwhile, the magnetic field sensor of FIG. 13 may further include a reading unit 800 connected to the driving electrode 120 to sense the intensity of a magnetic field based on the output signal out1 and the measurement signal V2.

As shown in FIG. 13, the reading unit 800 may include a mixer 810, a low-pass filter 820, an amplifier 830, a differentiator 840 and a converter 850.

The mixer 810 receives the output signal out1 of FIG. 10a output from the driving electrode unit 120 and the measurement signal V2 of FIG. 14a and mixes two signals to generate a mixing signal shown in FIG. 14b.

As the mixing signal, a signal having four components of 2ωc, 2ωc±ωc and ωr is output.

The low-pass filter 820 filters a value ωr of a low frequency among the mixing signal to block signals near the ωc, so that the signal of FIG. 14c is output. The amplifier 830 amplifies the filtered signal to output the amplified signal shown in FIG. 14d.

The amplifier 720 may be omitted when the value of the signal passing through the low-pass filter 610 is higher than a turn-on level of the diode of the differentiator 840.

The differentiator 840 and the converter 850 are operated the same as that of FIG. 11 so that a graph of a voltage to intensity of a magnetic field may be obtained as shown in FIG. 14e, so an A/D signal may be output corresponding to an amount of varied current with respect to target magnetic field intensity.

Therefore, the target magnetic field intensity may be read out according to the output value.

As described above, when the mixer 810 is used, the magnetic field sensor may be operable without any comparison electrode units so that the circuit may be simplified.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

The invention claimed is:

1. An amplitude modulator disposed on an area through which a magnetic field flows to modulate an amplitude, the amplitude modulator comprising:
   a substrate;
   a first driving electrode to receive first and second frequency signals supplied from the substrate and resonate due to the magnetic field; and
   a second driving electrode that receives the second frequency signal and carries out resonant motion with the first driving electrode due to the magnetic field,
   wherein the first and second frequency signals are amplitude-modulated by the resonant motion of the first and second driving electrodes to generate an amplitude modulated signal, and
   wherein the first frequency signal has a frequency equal to physical resonance frequencies of the first and second driving electrodes.

2. The amplitude modulator of claim 1, wherein the second frequency signal has a frequency greater than a frequency of the first frequency signal.

3. The amplitude modulator of claim 2, wherein the substrate includes:
   a first reference electrode to which the first and second frequency signals are applied,
   a second reference electrode to which the second frequency signal is applied,
   a first sensing electrode, and
   a second sensing electrode to output the modulated signal,
   wherein both ends of the first driving electrode are connected to the first reference electrode and the first sensing electrode, respectively, and
   both ends of the second driving electrode are connected to the second reference electrode and the second sensing electrode, respectively.

4. The amplitude modulator of claim 3, wherein the first driving electrode includes:
   a first body, and
   a first electrode piece protruding along both sides of the first body,
   the second driving electrode includes:
   a second body, and
   a second electrode piece protruding along both sides of the second body, and
   the first and second electrode pieces of the first and second driving electrodes are alternately arranged with each other.

5. The amplitude modulator of claim 4, further comprising elastic units which are formed between ends of the bodies of the first and second driving electrodes and the first and second reference electrodes and between ends of the bodies of the first and second driving electrodes and the first and second sensing electrodes, respectively.

6. An amplitude modulator disposed on an area through which a magnetic field flows to modulate an amplitude, the amplitude modulator comprising:
   a substrate;
   a first driving electrode to receive first and second frequency signals supplied from the substrate and resonate due to the magnetic field;
   a second driving electrode that receives the second frequency signal and carries out resonant motion with the first driving electrode due to the magnetic field; and
   a filter to output only the second frequency signal of the first and second frequency signals to the second driving electrode,
   wherein the first and second frequency signals are amplitude-modulated by the resonant motion of the first and second driving electrodes to generate an amplitude modulated signal.

7. The amplitude modulator of claim 3, wherein the first and second sensing electrodes are connected to a ground through an inductor, and
   the second sensing electrode outputs the modulated signal through a high-pass filter.

8. The amplitude modulator of claim 7, wherein the high-pass filter includes a capacitor.

9. The amplitude modulator of claim 1,
   wherein the substrate includes
   a support substrate, and
   an electrode layer on the support substrate, and
   the first and second driving electrodes are formed of the electrode layer exclusively.

10. The amplitude modulator of claim 1, wherein the amplitude modulator includes a MEMS device.

\* \* \* \* \*